United States Patent
Kanari

(10) Patent No.: US 7,961,547 B2
(45) Date of Patent: Jun. 14, 2011

(54) MEMORY DEVICE USING A COMMON WRITE WORD LINE AND A COMMON READ BIT LINE

(75) Inventor: Katsunao Kanari, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/923,671

(22) Filed: Oct. 1, 2010

(65) Prior Publication Data
US 2011/0026311 A1 Feb. 3, 2011

Related U.S. Application Data

(63) Continuation of application No. 12/213,974, filed on Jun. 26, 2008, now Pat. No. 7,817,492, which is a continuation of application No. PCT/JP2005/023917, filed on Dec. 27, 2005.

(51) Int. Cl.
*G11C 8/16* (2006.01)
(52) U.S. Cl. ......... 365/230.05; 365/189.16; 365/189.04; 365/189.05
(58) Field of Classification Search ............. 365/189.16, 365/189.04, 189.05, 230.05
See application file for complete search history.

(56) References Cited

U.S. PATENT DOCUMENTS

| | | | | |
|---|---|---|---|---|
| 5,355,335 | A | 10/1994 | Katsuno | 365/189.04 |
| 5,642,325 | A * | 6/1997 | Ang | 365/230.05 |
| 6,044,034 | A | 3/2000 | Katakura | |
| 2002/0036944 | A1* | 3/2002 | Fujimoto | 365/230.03 |
| 2002/0136053 | A1* | 9/2002 | Asano et al. | 365/158 |
| 2004/0053510 | A1 | 3/2004 | Little et al. | |
| 2004/0243758 | A1 | 12/2004 | Notani | |
| 2005/0141267 | A1* | 6/2005 | Kwon | 365/154 |
| 2005/0141272 | A1* | 6/2005 | Jung | 365/185.08 |
| 2005/0162896 | A1* | 7/2005 | Jung | 365/154 |
| 2005/0270885 | A1 | 12/2005 | Masuo | 365/230.05 |
| 2006/0023503 | A1* | 2/2006 | Lee | 365/185.05 |

FOREIGN PATENT DOCUMENTS

| | | |
|---|---|---|
| JP | 63-308783 | 12/1988 |
| JP | 4-64990 | 2/1992 |
| JP | 11-261017 | 9/1999 |
| JP | 2002-163890 | 6/2002 |

(Continued)

OTHER PUBLICATIONS

Niel H.E. Weste, et al., "CMOS VLSI design principle from system point of view", issued by Maruzen Co., Ltd., pp. 310-311, 1988.

(Continued)

*Primary Examiner* — Huan Hoang
*Assistant Examiner* — Jay Radke
(74) *Attorney, Agent, or Firm* — Staas & Halsey LLP

(57) ABSTRACT

A one read/two write SRAM circuit of which memory cell size is small, and high-speed operation is possible. The SRAM circuit includes first and second flip-flop circuits which are connected in parallel to a common write word line; a first write control circuit which is connected to said first flip-flop circuit, is conducted by a write control signal supplied to said write word line, and supplies a first write signal to said first flip-flop circuit; and a second write control circuit which is connected to said second flip-flop circuit, is conducted by a write control signal supplied to said write word line, and supplies a second write signal to said second flip-flop circuit.

5 Claims, 9 Drawing Sheets

FOREIGN PATENT DOCUMENTS

| | | |
|---|---|---|
| JP | 2003-78036 | 3/2003 |
| JP | 2004-355760 | 12/2004 |

OTHER PUBLICATIONS

U.S. Appl. No. 12/213,974, filed Jun. 26, 2008, Katsunao Kanari, Fujitsu Limited.

International Search Report mailed Feb. 28, 2006 in connection with the International Application No. PCT/JP2005/023917.

European Search Report issued Apr. 6, 2009 in corresponding European Patent Application 05822758.8.

Korean Office Action issued on Nov. 25, 2009 in corresponding Korean Patent Application 10-2008-7015590.

Japanese Office Action issued on Jul. 27, 2010 in related Japanese Patent Application No. 2007-551831.

Office Action mailed from the United States Patent and Trademark Office on Jan. 20, 2010 in the related U.S. Appl. No. 12/213,974.

Notice of Allowance mailed from the United States Patent and Trademark Office on Jul. 9, 2010, in the related U.S. Appl. No. 12/213,974.

Office Action mailed from the Chinese Patent Office on Aug. 27, 2010 in Chinese patent application No. 2005805243.1.

* cited by examiner

PRIOR ART

PRIOR ART

MEMORY DEVICE USING A COMMON WRITE WORD LINE AND A COMMON READ BIT LINE

CROSS-REFERENCE TO RELATED APPLICATIONS

This application is a continuation application of U.S. application Ser. No. 12/213,974 filed Jun. 26, 2008, now U.S. Pat. No. 7,817,492, which is a continuation of International Application No. PCT/JP2005/23917, filed on Dec. 27, 2005, now pending, herein incorporated by reference.

TECHNICAL FIELD

The present invention relates to a memory device using an SRAM circuit composed of Metal Oxide Semiconductor (hereafter MOS) transistors, of which data transfer speed or input data width and output data width are different, and a buffer circuit using this SRAM circuit, and more particularly to a downsizing and increasing speed of the memory device.

BACKGROUND OF THE INVENTION

A conventional SRAM (Static Random Access Memory) circuit has a one read/write circuit, in which a read port and a write port are in common. In this case, a port refers to an input/output interface for reading or writing data, a register for storing an address, a decoder for decoding an address, and a bit line and a word line to specify a position of an address. In the case of the one read/write circuit, reading and writing cannot be executed simultaneously. Also when data is read or written, an address position of reading or writing is determined using a common address decoder. Therefore the number of bits of an address used for reading and writing are the same.

On the other hand, an SRAM circuit having a plurality of ports has been proposed (e.g. see Non-patent Document 1).

A one read/two write SRAM circuit, which is an example of an SRAM circuit having a plurality of discrete ports, has one read port and two write ports. In this circuit, one address decoder for reading and two address decoders for writing are provided.

FIG. 7 is a diagram depicting a configuration of a conventional one read/two write SRAM circuit.

When reading data, a read address to indicate a read address position is first stored in a read address register RAR. The stored read address is supplied to a read column decoder RCDC and a read row decoder RRDC. The read column decoder RCDC and the read row decoder RRDC specify a row and a column of a read address position in a memory array 300 respectively. The data of the memory cell at the specified address position is output via an OR circuit 400.

When writing data to the one read/two write SRAM circuit, the two write addresses to indicate the two write positions respectively are stored in write address registers WAR1 and WAR2. The write address stored in the write address register WAR1 is stored in a write column decoder WCDC1 and write row decoder WRDC1. The write address stored in the write address register WAR2 is supplied to a write column decoder WCDC2 and write row decoder WRDC2. The two write column decoders and the two write row decoders specify the column and row at a write position on the memory array 300 respectively. To the two memory cells at the specified positions, the write data stored in the write data registers WDR1 and WDR2 are written via the write column decoders WCDC1 and WCDC2.

FIG. 8 is a diagram depicting a configuration of an SRAM cell used for a conventional one read/two write SRAM circuit. The conventional one read/two write SRAM cell comprises P-channel MOS transistors, N-channel MOS transistors, bit lines and word lines.

A P-channel MOS transistor 101 and an N-channel MOS transistor 102 are connected between the same two nodes, and constitute an inverter circuit. In the same way, a P-channel MOS transistor 103 and an N-channel MOS transistor 104 are connected between the same two nodes, and constitute an inverter circuit. A flip-flop circuit comprises of these four transistors using a loop of two inverter circuits, where one bit information is held.

An N-channel MOS transistor 105, the gate of which is connected to a read word lines +RWL, connects a read bit line +RBL and the node at the gate side of the transistors 101 and 102 constituting the inverter circuit. An N-channel MOS transistor 106, the gate of which is connected to a write word line +WWL0, connects a write bit line +WBL0 to the node at the gate side of the transistors 101 and 102 constituting the inverter circuit. An N-channel MOS transistor 107, the gate of which is connected to a write word line +WWL1, connects a write bit line +WBL1 to the node at the gate side of the transistors 101 and 102 constituting the inverter circuit.

An N-channel MOS transistor 108, of which gate is connected to the read word line +RWL, connects a read bit line –RBL to the node at the gate side of the transistors 103 and 104 constituting the inverter circuit. An N-channel MOS transistor 109, the gate of which is connected to a write word line –WWL0, connects a write bit line –WBL0 to the node at the gate side of the transistors 103 and 104 constituting the inverter circuit. An N-channel MOS transistor 110, the gate of which is connected to the write word line +WWL1, connects a write bit line –WBL1 to the node at the gate side of the transistors 103 and 104 constituting the inverter circuit.

When data is written to this SRAM cell, the write word line +WWL0, specified by the write row decoder WRDC1, is set to High state (hereafter H). By this, the N-channel MOS transistors 106 and 109 turn ON. Then the target data stored in the write data register WDR1 is input by the write column decoder WCDC1 via the specified write bit line +WBL0. At the same time, the opposite state of the write bit line +WBL0 is input via the write bit line –WBL0.

If the data to be stored is H, the N-channel MOS transistor 102 and the P-channel MOS transistor 103 turn ON, the node at the gate side of the transistors 101 and 102 constituting the inverter circuit is fixed to H, and the node at the gate side of the transistors 103 and 104 constituting the inverter circuit are fixed to Low state (hereafter L).

Data can be simultaneously written to this SRAM cell using a port of another system. In this case, the word line +WWL1 specified by the write row decoder WRDC2 is set to H. By this, the N-channel MOS transistors 107 and 110 turn ON. Then the target data to be stored in the write data register WDR2 is input by the write column decoder WCDC2 via the specified bit line +WBL1. At the same time, the opposite state of the bit line +WBL1 is input via the bit line –WBL1.

If the data to be stored is L, the N-channel MOS transistor 104 and the P-channel MOS transistor 101 turn ON, the node at the gate side of the transistors 101 and 102 constituting the inverter circuit is fixed to L, and the node at the gate side of the transistors 103 and 104 constituting the inverter circuit are fixed to H. By simultaneously writing data to different cells using the two systems, the write speed can be increased. In this case, hardware to prohibit the two systems from simultaneously writing a same position is necessary.

When data is read from this SRAM cell, the read word line +RWL selected as a result of decoding by the read row decoder RRDC is set to H. By this, the N-channel MOS transistors 105 and 108 turn ON. Then the data stored at the gate side of the transistors 101 and 102 constituting the inverter circuit, which is a part of the loop of the flip-flop circuit, is output from the read bit line +RBL specified by the read column decoder RCDC. At the same time, the opposite state of the read bit line +RBL is output from the read bit line −RBL by the inverter circuit inverting the state of the read bit line +RBL.

In the case of this one read/two write SRAM circuit, the number of write ports is double the number of read ports, so the data width is different between the data to be input and the data to be output. By simultaneously writing different cells using two systems, the data write speed can be virtually increased to double, and [the SRAM circuit] is used as a buffer circuit of which data write speed and data read speed are different.

FIG. 9 is a diagram depicting an example of using the one read/two write SRAM circuit. A central processing unit (hereafter CPU) 100 outputs the data D1 acquired by computation to a one read/two write SRAM circuit 101a. For fast computation, the CPU 100 is demanded to immediately output the acquired data and start another computation.

Hence the one read/two write SRAM circuit 101a receives the data using the two write ports, and outputs the data D2 via one read port. Since the number of read ports is ½ the number of write ports, the virtual transfer speed required for reading the data D2 becomes ½ the transfer speed required for writing the data D1.

A one read/two write SRAM circuit 101b receives the data D2, which is an output of the one read/two write SRAM circuit 101a, and write the data using two write ports. The written data D2 is read by one read port, and is output as data D3. Since the number of read ports is ½ the number of write ports, the virtual transfer speed required for reading the data D3 becomes ½ the transfer speed required for writing the data D2. As a result, the transfer speed required for reading the data D3 becomes one fourth the transfer speed required for writing the data D1.

In this way, the data, which is output from the CPU, gradually decreases the transfer speed. Since the data D1, which is output from the CPU, is not output very frequently, the speed may drop after the processing to receive the data D1 is executed as fast as possible. This way the CPU can perform a kind of release processing, that is, outputting data without waiting for an end of slow processing of the memory circuit in subsequent stages of the data D3.

Non-patent Document 1: "Niel H. El Weste, Kamran Eshraghi, "Principle of CMOS VLSI design from a system point of view", issued by Maruzen Co., Ltd, pp. 310, 1988

However in the case of a conventional one read/two write SRAM circuit, which writes data at double speed by providing two write ports, one read address register and two write address registers are required. In the same way, one read address decoder and two write address decoders are required. Since these circuits are installed to be redundant, decreasing the size of a conventional one read/two write SRAM circuit is difficult.

Also in the one read/two write SRAM circuit, many word lines and transistors are used, which increases the memory cell size. Therefore the bit lines and the word lines become long, and resistance and wiring capacity increase. If resistance and wiring capacity increase, the drive current for driving the transistors decreases (since an increase in wiring capacity increases the load to be driven by the transistors), and it is difficult to increase the speed of the one read/two write SRAM circuit.

SUMMARY OF THE INVENTION

With the foregoing in view, it is an object of the present invention to provide a one read/two write SRAM circuit of which memory cell size is small.

It is another object of the present invention to provide a one read/two write SRAM circuit of which memory cell size is small, and high-speed operation is possible.

It is still another object of the present invention to provide a buffer circuit using an SRAM circuit of which memory cell size is small.

It is still another object of the present invention to provide a buffer circuit using an SRAM circuit of which memory cell size is small, and high-speed operation is possible.

To solve the above problems, an SRAM circuit according to a first aspect of the present invention has: a plurality of memory cells composed of a pair of storage units respectively; a plurality of write word lines for specifying rows of the plurality of memory cells; a plurality of read word line pairs for specifying rows of the plurality of memory cells; a write row decoder for driving the write word line, which is common to the pair of storage units, when data is written to the pair of storage units; a read row decoder for driving the read word line, which is connected to the storage unit, when data is read from the storage unit; a plurality of write bit line pairs for specifying the pair of storage units when data is written to the pair of storage units, and writing data to be input to both of the pair of storage units, which are commonly specified by the write word lines, respectively; and (one or more, the same in the following description) read bit lines for specifying the storage unit when data is read from the storage unit and reading data from the storage unit, which is commonly specified by the read word lines.

It is preferable that the first aspect of the present invention further has a write column decoder, characterized in that the write column decoder selects a write bit line to which [data] is written out of the write bit line pairs based on the least high-order bit of a write address to be input.

In the first aspect of the present invention, it is preferable that the read row decoder selects a read word line from which [data] is read out of the read word line pairs based on the least high-order bit of a read address to be input.

In the first aspect of the present invention, it is preferable that the write column decoder simultaneously drives the pair of write bit lines, and simultaneously writes data to the pair of storage units.

It is preferable that the first aspect of the present invention further has a first and a second write transistors, and in the first write transistor, the write word line is connected to the gate side, and one of the write bit line pairs and one of the pair of storage units are connected based on the supply of a signal to the gate, and in the second write transistor, the write word line is connected to the gate side and the other of the write bit line pair and the other of the pair of storage units are connected based on the supply of a signal to the gate.

It is preferable that the first aspect of the present invention further has a first and second read transistors, and in the first read transistor, one of the read word line pair is connected to the gate side, and the read bit line and one of the pair of storage units are connected based on the supply of a signal to the gate, and in the second read transistor, the other of the read word line pair is connected to the gate side, and the read bit line and the other of the pair of storage units are connected based on the supply of a signal to the gate.

In the first aspect of the present invention, it is preferable that when [data] is written to the pair of storage units, all of the memory cells specified by the write word lines are specified by the write bit line pairs, and [the data] is simultaneously written to all of the pairs of storage units which are specified.

In the first aspect of the present invention, it is preferable that when [data] is read from the storage unit, all of the memory cells specified by the read word lines are specified by the read bit lines, and [the data] is simultaneously read from all the storage units which are specified.

A buffer circuit according to a second aspect of the present invention has a plurality of SRAM circuits, each of which has: a plurality of memory cells further having a pair of storage units respectively; a plurality of write word lines for specifying rows of the plurality of memory cells; a plurality of read word line pairs for specifying rows of the plurality of memory cells; a write row decoder for driving the write word line common to the pair of storage units when [data] is written to the pair of storage units; a read row decoder for driving the read word line which is connected to the storage unit when [data] is read from the storage unit; a plurality of write bit line pairs for specifying the pair of storage units when [data] is written to the pair of storage units, and writing data to be input to both of the pair of storage units which are commonly specified by the write word lines respectively; and a plurality of read bit lines for specifying the storage unit when [data] is read from the storage unit and reading data from the storage unit which is commonly specified by the read word lines, characterized in that the read bit line of the SRAM circuit and one of the write bit line pairs of another SRAM circuit are inter-connected.

The SRAM circuit of the present invention can implement a higher processing speed and a smaller memory size by accessing 2-bit information using common write word lines.

DESCRIPTION OF THE PREFERRED EMBODIMENT

Embodiments of the SRAM circuit will now be described with reference to the drawings. The technical scope of the SRAM circuit, however, is not limited to these embodiments, but extend to the contents of the Claims and equivalents thereof.

Figure 1:
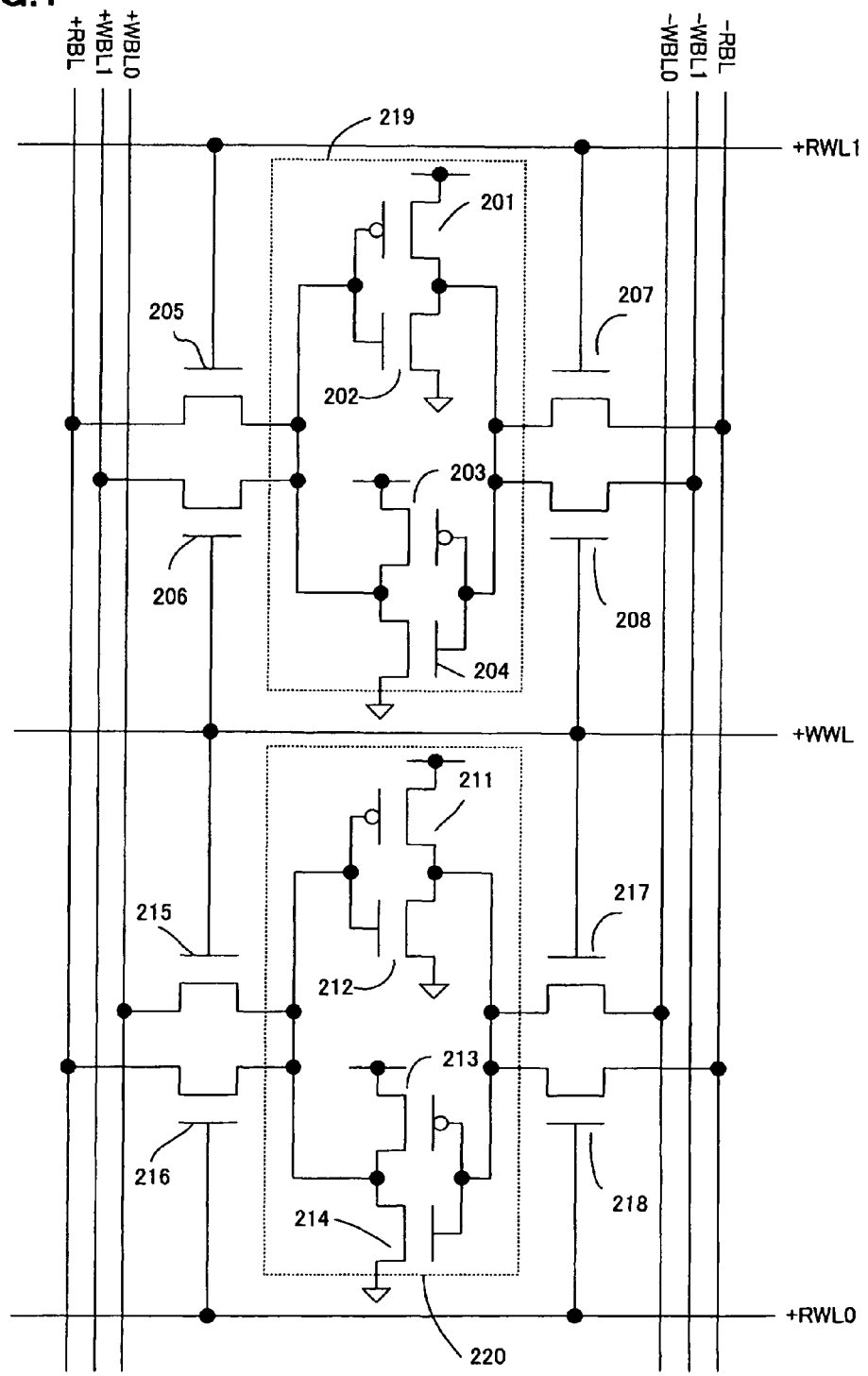
FIG. 1 is a diagram depicting a configuration of an SRAM cell to which the present embodiment is applied.

FIG. 1 is a diagram depicting a configuration of an SRAM to which an embodiment of the SRAM circuit is applied. The SRAM of the present embodiment has a pair of storage units 219 and 220 for storing 1 bit, and 4 P-channel MOS transistors and 12 N-channel MOS transistors. The pair of storage units included in the SRAM cell are accessed via 6-bit lines and 3 word lines. While one port is used for reading, two ports are used for writing.

The P-channel MOS transistor 201 and the N-channel MOS transistor 202 are connected between the same two nodes. In the same way, the transistors 203 and 204, 211 and 212 and 213 and 214 are connected between the same two nodes. Since the pair of storage units 219 and 220 are constructed by these 8 transistors, 2-bit information can be stored in the SRAM cell in FIG. 1.

An N-channel MOS transistor 205, the gate of which is connected to a read word line +RWL1, connects a read bit line +RBL to a node at the gate side of the transistors 201 and 202 which constitute an inverter circuit. In the same way, an N-channel MOS transistor 207, the gate of which is connected to the read word line +RWL1, connects a read bit line −RBL and a node at the gate side of the transistors 203 and 204 which constitute an inverter circuit. An N-channel MOS transistor 216, the gate of which is connected to a read word line +RWL0, connects the read bit line +RBL to a node at the gate side of the transistors 211 and 212 which constitute an inverter circuit. In the same way, an N-channel MOS transistor 218, the gate of which is connected to the read word line +RWL0, connects the read bit line −RBL to a node at the gate side of the transistors 213 and 214 which constitute an inverter circuit. N-channel MOS transistors 206, 208, 216 and 218, the gate of which are connected to a write word line +WWL, are connected to the write bit lines +WBL1, −WBL1, +WBL0 and −WBL0 respectively.

To write data to this SRAM cell, the write word line +WWL is set to H first. By this, the N-channel MOS transistors 206, 208, 215 and 217 turn ON. Then the data to be stored is input from write bit lines +WBL0 and +WBL1. At the same time, a reversed state of the write bit line +WBL0 is input from the write bit line −WBL0, and a reversed state of the write bit line +WBL1 is input from the write bit line −WBL1.

The data which is input from the write bit line +WBL1 via the N-channel MOS transistor 206 is held at the gate side of the transistors 201 and 202 constituting the inverter circuit. The data which is input from the write bit line +WBL0 via the N-channel MOS transistor 215 is held at the gate side of the transistors 211 and 212 constituting the inverter circuit.

If the data to be stored in the node at the gate side of the transistors 201 and 202 constituting the inverter circuit is H, the N-channel MOS transistor 202 and the P-channel MOS transistor 203 turn ON, the node at the gate side of the transistors 201 and 202 constituting the inverter circuit is fixed to H, and the node at the gate side of the transistors 203 and 204 constituting the inverter circuit is fixed to L.

Simultaneously with storing data in the node at the gate side of the transistors 201 and 202 constituting the inverter circuit, [data] can be written to the node at the gate side of the transistors 211 and 212 constituting the inverter circuit, using a port of another system. In this case, at a timing when the write word line +WWL becomes H, the data to be stored is input from the write bit line +WBL0. If the data to be stored in the node at the gate side of the transistors 211 and 212 constituting the inverter circuit is L, the N-channel MOS transistor 214 and the P-channel MOS transistors 211 turn ON, the node at the gate side of the transistors 211 and 212 constituting the inverter circuit is fixed to L, and the node at the gate side of the transistors 213 and 214 constituting the inverter circuit is fixed to H.

To read data from this SRAM cell, the read word line +RWL1 is set to H first. By this, the N-channel MOS transistors 205 and 207 turn ON. Then the data stored in the node at the gate side of the transistors 201 and 202 constituting the inverter circuit is output from the read bit line +RBL. At the same time, an opposite state of the read bit line +RBL is output from the read bit line −RBL.

Then the read word line +RWL0 is set to H. By this, the N-channel MOS transistors 216 and 218 turn ON. Then the data stored in the node at the gate side of the transistors 211 and 212 constituting the inverter circuit is output from the read bit line +RBL. At the same time, an opposite state of the read bit line +RBL is output from the read bit line −RBL.

Figure 8:
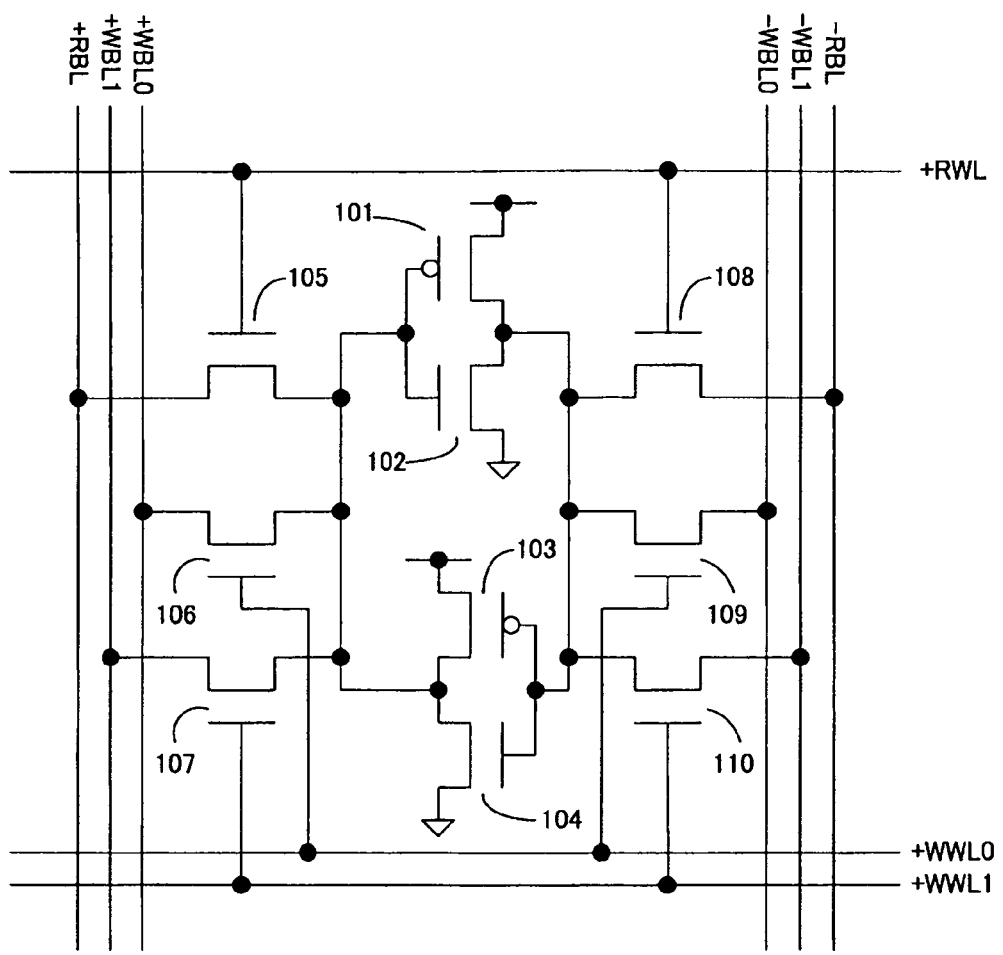
FIG. 8 is a diagram depicting a configuration of an SRAM cell which is used for a conventional one read/two write SRAM circuit.
Figure 9:
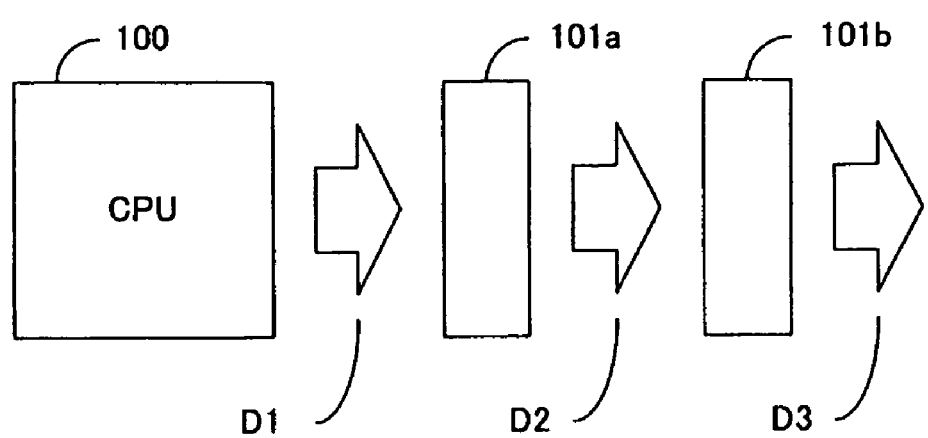
FIG. 9 is a diagram depicting an example of using the one read/two write SRAM circuit.

The SRAM cell of the present embodiment shown in FIG. 1 holds information double that of the conventional SRAM cell shown in FIG. 8. This is because the conventional SRAM cell shown in FIG. 8 comprises 10 transistors, 3 word lines and 6 bit lines, whereas the SRAM cell of the present embodiment comprises 16 transistors, 3 word lines and 6 bit lines. Since the SRAM cell of the present embodiment holds information double the conventional circuit, [the SRAM circuit] can save 4 transistors, 3 word lines and 6 bit lines compared with the conventional SRAM cell comprising 20 transistors, 6 word lines and 12 bit lines, if comparison is performed in the capacity in 2-bit units. Therefore compared with the prior art, the SRAM circuit can decrease the physical volume, such as transistors and word lines, per unit storage capacity.

By this decrease of transistors, word lines and bit lines, the SRAM circuit size can be decreased. By decreasing the size of the SRAM circuit due to the decrease of physical volume per unit storage capacity, the line lengths of the word lines and bit lines are decreased, and the resistance values of the word lines and bit lines are also decreased, hence the drive current for driving the transistors can be decreased. By the increase of the drive current, operation of the transistors becomes faster, and the SRAM circuit itself can be faster.

Figure 2:
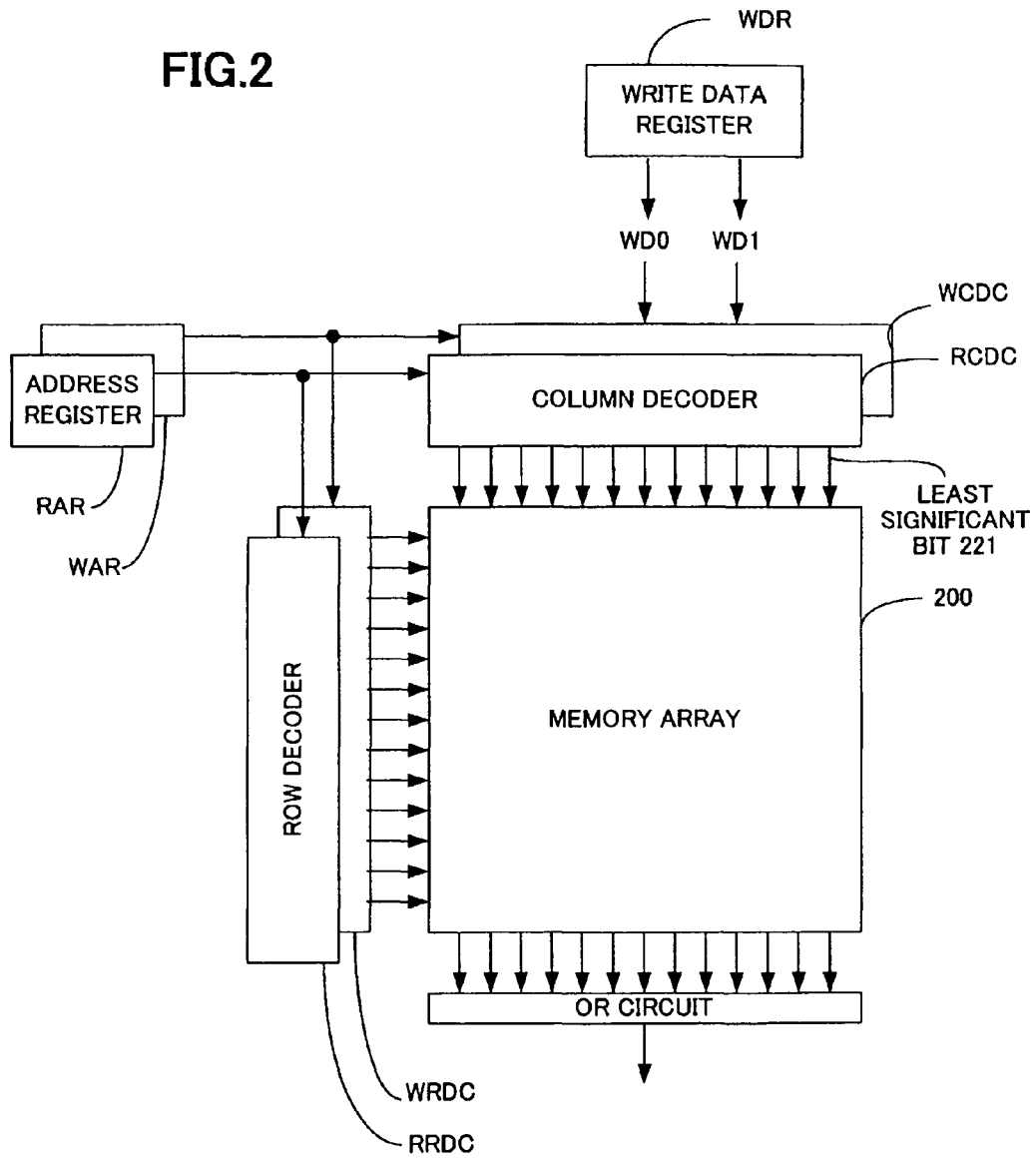
FIG. 2 is a diagram depicting a configuration of an SRAM circuit according to a first embodiment of the present embodiment.

FIG. 2 is a diagram depicting a configuration of an SRAM circuit according to a first embodiment of the SRAM circuit.

To read data from a memory cell array 200 comprising the SRAM cell of the SRAM circuit, a bit string to indicate a read address is stored in a read address register RAR. Based on low-order bits of the stored bit string, excluding the least high-order bit (column address), a read column decoder RCDC drives a corresponding read bit line. At the same time, based on the high-order bits (row address) and the least high-order bit (selection bit) 221 of the stored bit string, a read row decoder RRDC drives a corresponding read word line. The least high-order bit 221 is a selection bit which is used for determining which one of the read word lines +RWL1 and +RWL0 in FIG. 1 is driven. If the least high-order bit is 0 (in the case of an even address), the read word lines +RWL0 is driven, and if the least high-order bit 1 (in the case of an odd address), the read word line +RWL1 is driven.

By driving an appropriate word line and appropriate bit lines, the transistor 205 and 207 or 216 and 218 in FIG. 1 are turned ON, and the desired memory cell can be accessed to read the stored data. The data in the memory array 200 accessed based on the bit string stored in the read address register RAR is output by determining OR of all the bit lines connected to the memory array 200 (OR logic operation).

To write data to the memory cell array 200 comprising the SRAM cell of the SRAM circuit, a bit string to indicate a write address is stored in a write address register WAR. If the number of bits of the address used for reading is N at this time, then the number of bits of the address used for writing is N−1. Because data for the case when the selection bit, which is the least high-order bit, of the address used for reading is 1 (in the case of an odd address) and the case when this bit is 0 (in the case of an even address) can be stored in a same cell, data for the odd address and data for the even address are simultaneously written to the same cell.

When N−1 bits of a bit string to indicate a write address, excluding the selection bit which corresponds to the least high-order bit, is stored in the write address register WAR, the write column decoder WCDC decodes this column address based on the low-order bits (column address) of the stored bit string, and drives the write bit line. Based on the high-order bits (row address) of the stored bit string, the write row decoder WRDC decodes the row address, and drives the write word line +WWL. When the bit line is driven, AND of the data WD0 of which least high-order bit of the write position address is 0 (even address) and data WD1 of which least high-order bit of the write position address is 1 (odd address) with the signals to drive the write bit lines +WBL0 and +WBL1 in FIG. 1 are determined (AND logic operation), and the results are written in the cell. For example, a case of simultaneously writing data WD0 and data WD1 to an even address and an odd address in the SRAM cell in FIG. 1 according to the present embodiment will be described. To write data to this SRAM cell, the write word line +WWL is set to H first. By this, the N-channel transistors 206, 208, 215 and 217 turn ON. Then data WD0 is input from the write bit line +WBL0 which corresponds to the even address, and data WD1 is input from the write bit line +WBL1 which corresponds to the odd address. If data WD0 is 0 here, then 0, which is a result of AND of this value with the value 1 of the signal for driving the write bit line +WBL0 (AND logic operation), is input from +WBL0, and if data WD0 is 1, then 1, which is a result of AND of this value with the value 1 of the signal for driving the write bit line +WBL0 (AND logic operation), is input from +WBL0. In the same way, if data WD1 is 0, then 0, which is the result of AND of this value with the value 1 of the signal for driving the write bit line +WBL1 (AND logic operation), is input from +WBL1, and if data WD1 is 1, then 1, which is the result of AND of this value with the value 1 of the signal for driving the write bit line +WBL1 (AND logic operation), is input from the +WBL1. At the same time, a reversed state of the write bit line +WBL0 is input from the write bit line −WBL0, and an opposite state of the write bit line +WBL1 is input from the write bit line −WBL1.

The data which is input from the write bit line +WBL1 via the N-channel MOS transistor 206 is held at the gate side of the transistors 201 and 202 constituting the inverter circuit. The data which is input from the write bit line +WBL0 via the N-channel MOS transistor 215 is held at the gate side of the transistors 211 and 212 constituting the inverter circuit.

In the conventional one read/two write SRAM circuit, the two write address registers WAR, the two write column decoders WCDC, the two write row decoders WRDC and the two write data registers WDR are required, but in the SRAM circuit of the present embodiment which has the above configuration, the number of these elements can be one each. The write column decoder WCDC can be smaller and faster, since the least high-order bit, which corresponds to the selection bit to select either the even address or the odd address, is unnecessary. In this way, the SRAM circuit can be downsized by simplifying the peripheral circuits of the memory array.

Also in the conventional one read/two write SRAM circuit, which has two write systems, hardware for exclusive control to prohibit the two systems from writing a same position is required. But in the SRAM circuit of the SRAM circuit, where simultaneously writing data at a same position does not occur, this hardware for exclusive control can be omitted, and downsizing is possible.

Now a second embodiment of the SRAM circuit will be described.

Figure 3:
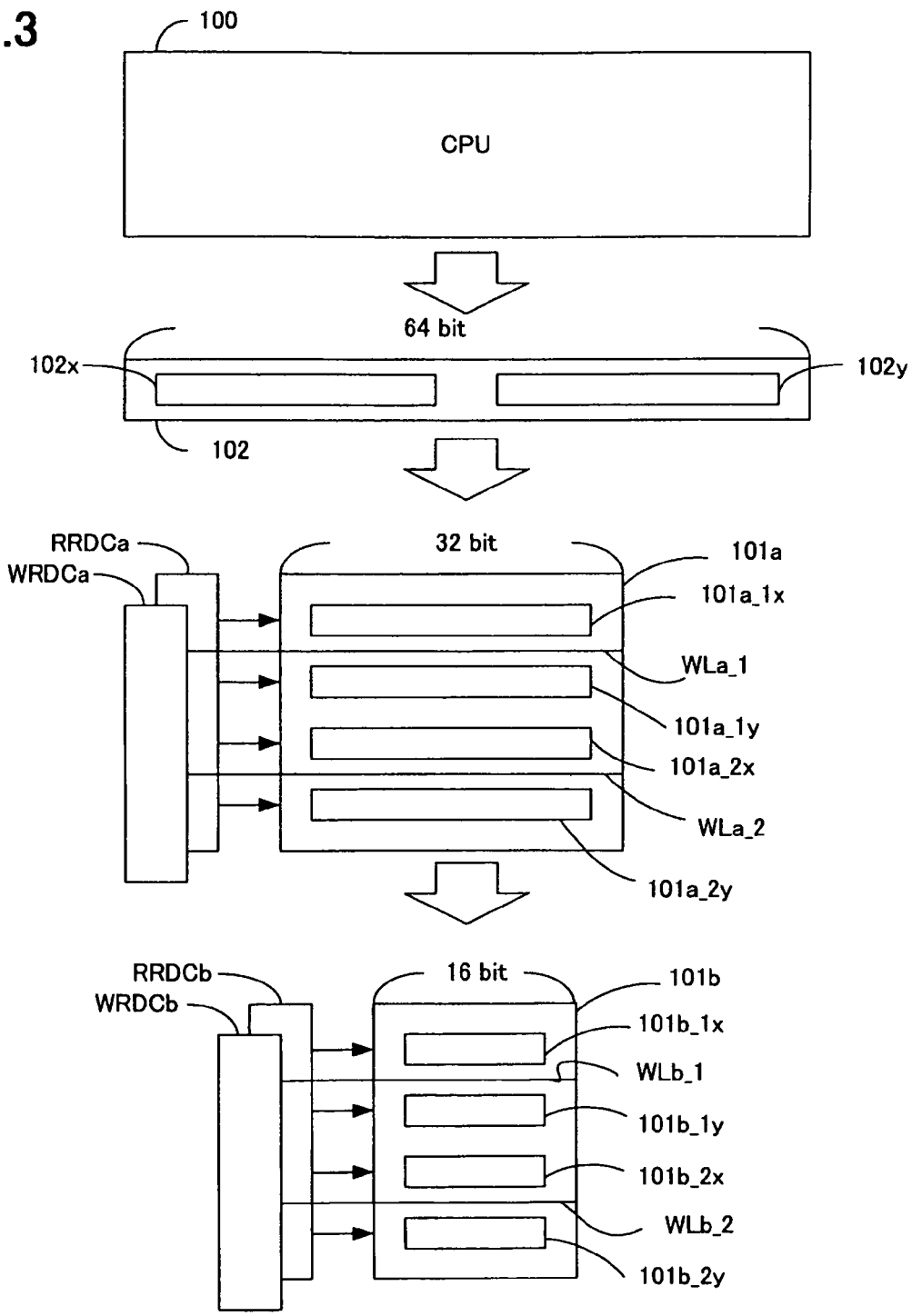
FIG. 3 is a diagram depicting an example when the SRAM of the present embodiment is applied to a buffer circuit.

FIG. 3 shows an example when the SRAM circuit is applied to a buffer circuit. The operation result of a CPU 100 is stored in a register 102. Here the register 102 has a 64-bit data length, and virtually includes a high-order bit section 102x for storing high-order 32-bit data and a low-order bit section 102y for storing low-order 32-bit data.

The data temporarily held in the register 102 must be stored in a buffer circuit 101a immediately for the CPU 100 to start the next operation.

The data width of the SRAM circuit 101a of the present embodiment, which is used as a buffer circuit, has a 32-bit length, but since 2-bit information can be stored in one cell in the circuit configuration of the present embodiment, writing can be performed simultaneously from two systems, that is, high-order bit section 102x and low-order bit section 102y, of the register 102.

In order to simultaneously specify an address 1 section 101a_1x which corresponds to an odd address of the SRAM circuit 101a and an address 0 section 101a_1y which corresponds to an even address, a write row decoder WRDCa drives a write word line WLa_1 which exists between [the address 1 section and address 0 section]. The 32-bit long data of the high-order bit section 102x of the register 102 is written to the address 1 section 101a_1x of the SRAM circuit 101a. The 32-bit long data of the low-order bit section 102y of the register 102 is written to the address 0 section 101a_1y of the SRAM circuit 101a.

Now how the register 102 and the SRAM circuit 101a are connected so as to perform the above mentioned simultaneous write operation to the address 1 section corresponding to the odd address and the address 0 section corresponding to the even address of the SRAM circuit will be described.

Figure 4:
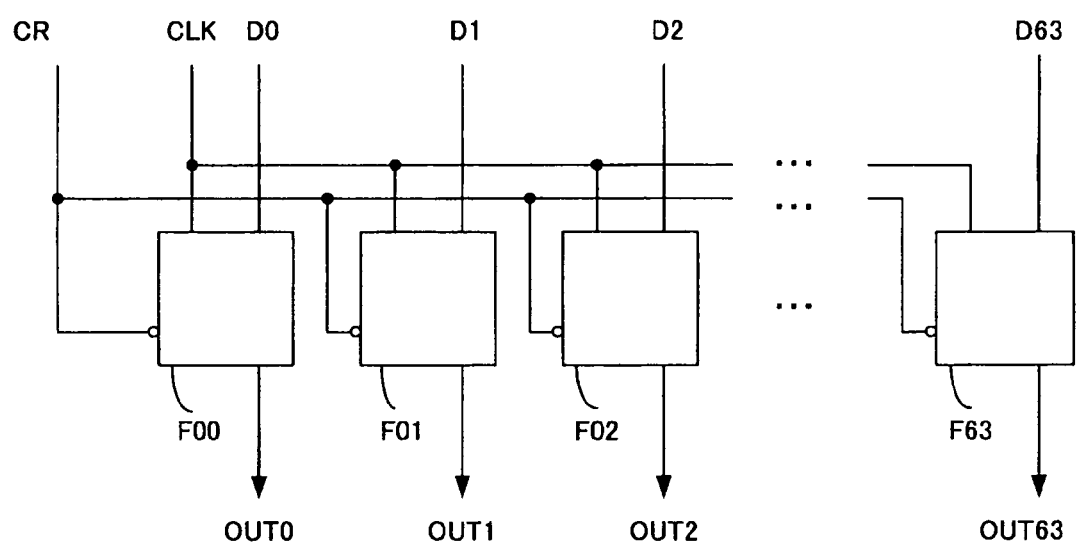
FIG. 4 is a diagram depicting a configuration of a register 102 for holding the computation result of CPU 100.
Figure 5:
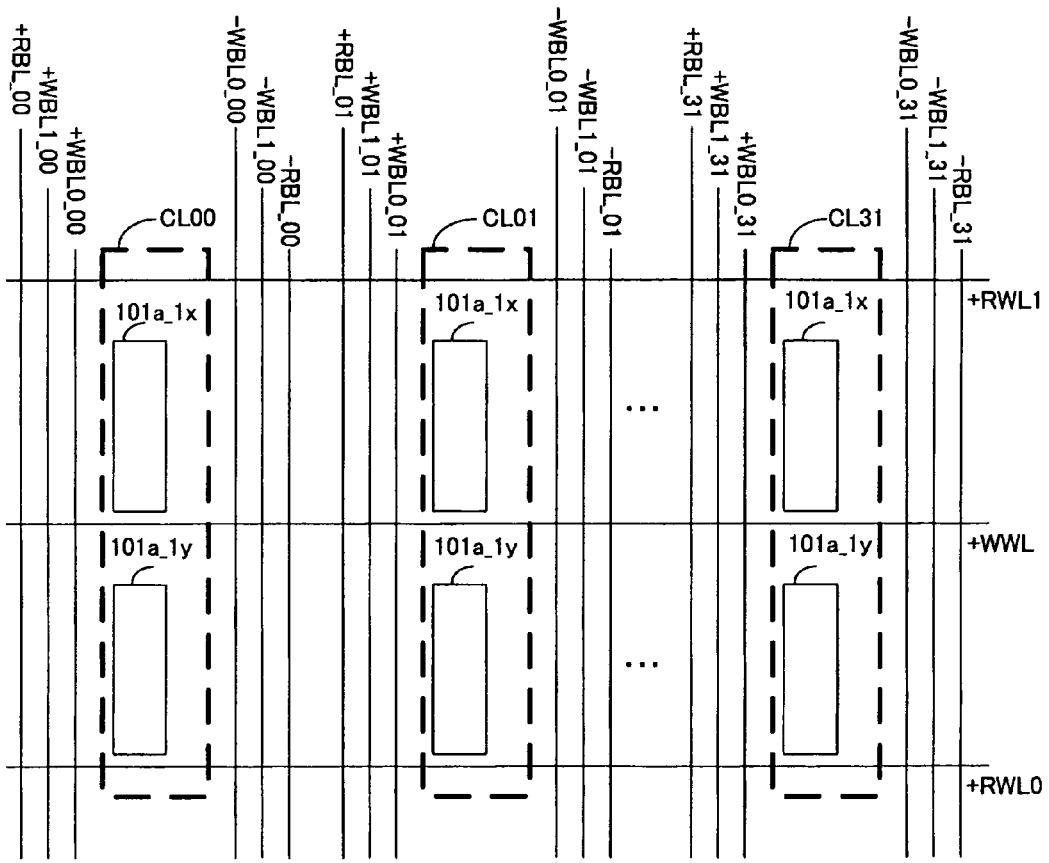
FIG. 5 is a diagram depicting the SRAM circuit of the present embodiment which is applied to the buffer circuit.

FIG. 4 is a diagram depicting an internal configuration of the register 102 for holding the operation result of the CPU 100. FIG. 5 shows the SRAM circuit 101a of the present embodiment, which is applied to a buffer circuit. As FIG. 1 shows, the register 102 comprises 64 flip-flops F00 to F63, which are constructed by loops of inverter circuits where P-channel MOS transistors (202, 204, 212 and 214 in FIG. 1) and N-channel MOS transistors (201, 203, 211 and 213 in FIG. 1) are connected between the same two nodes. Out of the 64 flip-flops F00 to F63, the flip-flops F0 to F31 are assigned to the high-order bit section 102x of the register 102, and the flip-flops F32 to F63 are assigned to the low-order bit sections 102y of the register 102. To each of the 64 flip-flops, a clear signal for resetting the content held by the flip-flop, and a clock signal CLK for driving the flip-flop, are input. To the 64 flip-flops from F00 to F63, the bits D0 to D63 which are the operation result of the CPU 100 are connected as data input.

The flip-flops F00 to F63 output the data which is input from the bits D0 to D63 as output signals OUT0 to OUT63, until the clear signal CR is input. In other words, the operation result of the CPU 100 is held in the register 102 until the clear signal CR is input.

The output signals OUT0 to OUT63 from the register 102 are input to the write bit lines +WBL0 and +WBL1 of the SRAM circuit 101a of the present embodiment, constituting the flip-flops CL00 to CL31 respectively in FIG. 5. The reverse signals of the output signals OUT0 to OUT63 from the register 102 are input to the write bit lines −WBL0 and −WBL1 of the SRAM circuit 101a of the present embodiment, constituting the flip-flops CL00 to CL31 respectively in FIG. 5.

More specifically, output signals OUT0 to OUT31 of the flip-flop F00 to F31, which is a high-order bit section 102x of the register 102, are input to the write bit lines +WBL1_00 to +WBL1_31 in FIG. 5 respectively. The reverse signals of the output signals OUT0 to OUT31 from the flip-flop F00 are input to the write bit lines −WBL1_00 to −WBL1_31 in FIG. 5 in the same manner.

The output signals OUT32 to OUT63 from the flip-flop F32 to F63, which is a low-order bit section 102y of the register 102, are input to the write bit lines +WBL0_00 to +WBL0_31 in FIG. 5. The reverse signals of the output signals OUT32 to OUT63 from the flip-flops F32 to F63 are input to the write bit lines −WBL0_00 to −WBL0_31 in FIG. 5 in the same manner.

Simultaneously with the above mentioned input of data to the write bit line, the write row decoder WRDCa in FIG. 3 drives the word line +WWL in FIG. 5 based on the row address decoding result. The signals which were input to the memory cells CL00 to CL31 specified by the word line +WWL via the write bit lines +WBL1_00 to +WBL1_31 are stored in the corresponding address 1 section 101a_1x if the write address is an odd address, and the signals which were input from the write bit lines +WBL0_00 to +WBL0_31 are stored in the corresponding address 0 section 101a_1y if the write address is an even address.

Now the case of reading data from the SRAM circuit 101a in FIG. 3 and writing the data to the SRAM circuit 101b will be described.

First the read row decoder RRDCa in FIG. 3 specifies a row from which data is read in the SRAM circuit 101a, based on the row address decoding result. In the case of FIG. 3, a row is selected from the four rows: 101a_1x, 101a_1y, 101a_2x and 101a_2y. Here it is assumed that the read word line +RWL corresponding to the address 1 section 101a_1x, which is an odd address, is driven in FIG. 5. And the write row decoder WRDCb selects a row in the SRAM circuit 101b to which data is written. Here it is assumed that the address 1 section 101b_1x and address 0 section 101b_1y of the SRAM circuit 101b are simultaneously specified, and for this, the write word line +WWL which exists there between in FIG. 5 is driven.

The 16-bit long high-order data of the address 1 section 101a_1x, which is an odd address in the SRAM circuit 101a, is written to the address 1 section 101b_1x, which is an odd address in the SRAM circuit 101b. The 16-bit long low-order data of the address 1 section 101a_1x, which is an odd address in the SRAM circuit 101a, is written to the address 0 section 101b_1y, which is an even address in the SRAM circuit 101b.

Now how the SRAM circuits 101a and 101b are connected to perform the above mentioned operation will be described.

Figure 6:
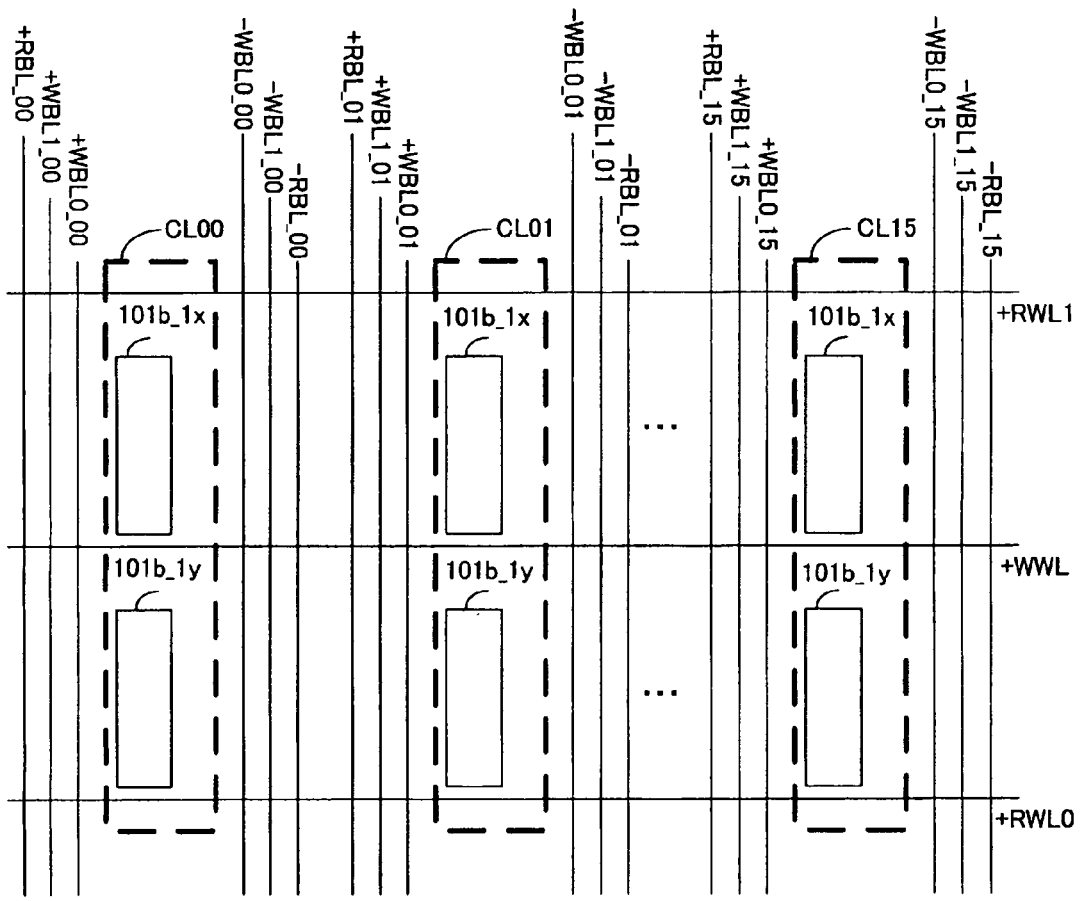
FIG. 6 is a diagram depicting the SRAM circuit 101b of the present embodiment which is applied to the buffer circuit.
Figure 7:
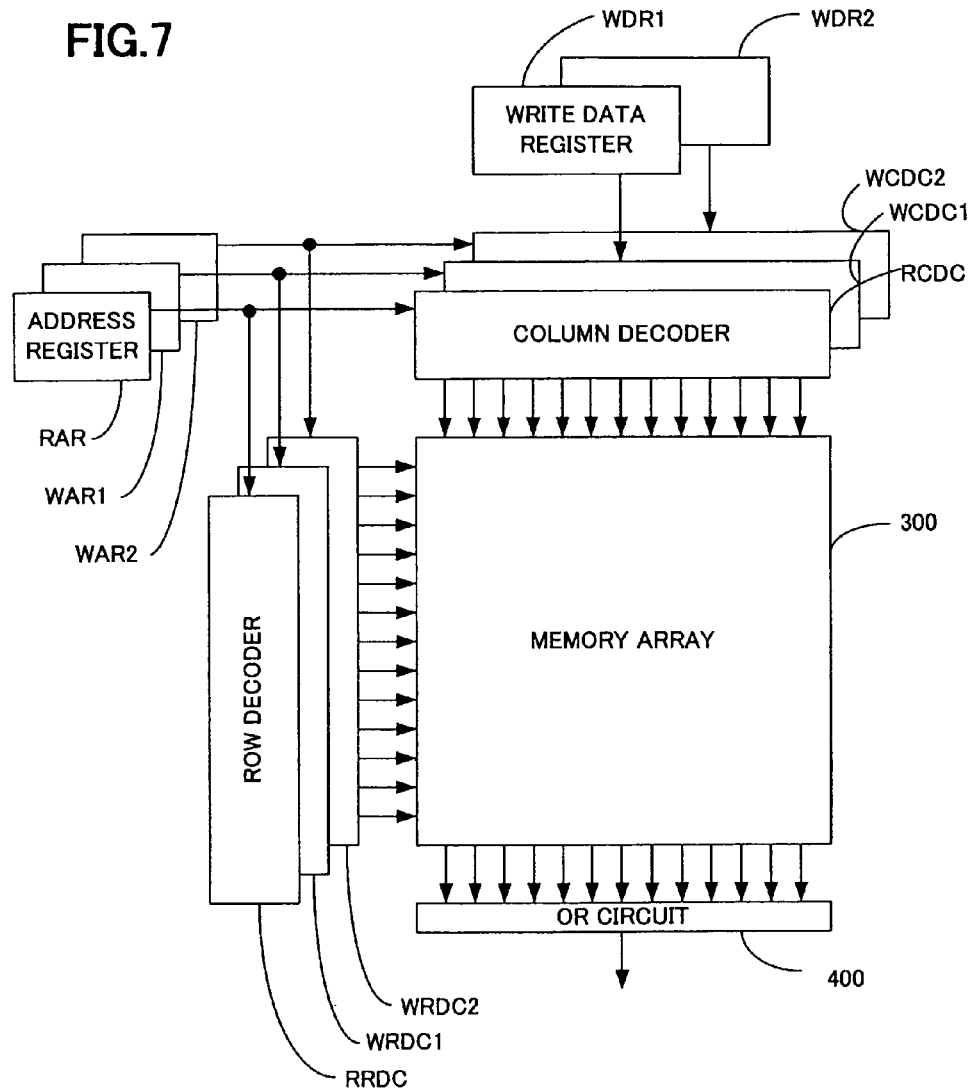
FIG. 7 is a diagram depicting a configuration of a conventional one read/two write SRAM circuit.

FIG. 6 is the SRAM circuit 101b which is applied to the buffer circuit. −[Data]− output from the read bit lines +RBL_00 to +RBL_31 in the SRAM circuit 101a in FIG. 5 is input to the write bit lines +WBL1_00 to WBL1_15 and +WBL0_00 to +WBL0_15 in FIG. 6 respectively.

More specifically, the read bit lines +RBL_00 to +RBL_15 for outputting 16-bit long high-order data of the address data, which is an output from the SRAM circuit 101a in FIG. 3, are input to the write bit lines +WBL1_00 to WBL1_15 in FIG. 6. And the read bit lines +RBL_16 to +RBL_31, for outputting 16-bit long low-order data, which is an output from the SRAM circuit 101a in FIG. 3, are input to the write bit lines +WBL0_00 to +WBL0_15 in FIG. 6.

The read bit lines −RBL_00 to −RBL_15, for outputting reverse signals of the 16-bit long high-order data of the address data, which is an output from the SRAM circuit 101*a* in FIG. 3, are input to the write bit lines WBL1_00 to −WBL1_15 in FIG. 6. And the read bit lines −RBL_16 to −RBL_31, for outputting the reverse signals of the 16-bit long low-order data, which is an output from the SRAM circuit 101*a* in FIG. 3, are input to the write bit lines −WBL0_00 to −WBL0_15 in FIG. 6.

At the same time, with the input of the data to the write bit lines, the write row decoder WRDCb in FIG. 3 drives the word line +WWL in FIG. 6 based on the row address decoding result. The signals which were input from the write bit lines +WBL1_00 to WBL1_15 to the memory cells CL00 to CL15 specified by the word line +WWL are stored in the corresponding address 1 section 101*b*_1*x* if the write address is an odd address, and the signals which were input from the write bit lines +WBL0_00 to +WBL0_15 are stored in the corresponding address 0 section 101*b*_1*y* if the write address is an even address.

As described above, the buffer circuit described above comprises memory cells using the SRAM circuit of the present embodiment, so the circuit size can be decreased by decreasing such elements as the transistors and word lines.

By this downsizing, the word lines and bit lines become shorter, and resistance values of the word lines and bit lines also decrease, therefore the drive current for driving the transistors can be increased. If the drive current increases, the transistor operation can be faster, and speed of the SRAM circuit itself can be increased.

Also omitting one write row decoder, out of the two write row decoders which have conventionally been required, can decrease the size of the SRAM circuit.

What is claimed is:

1. A memory circuit, comprising:
    first and second memory cells which are connected in parallel between a common write word line and a common read bit line;
    a first write control circuit which is connected to the first memory cell to be conducted by a write control signal supplied to the common write word line, and to supply a first write signal to the first memory cell;
    a second write control circuit which is connected to the second memory cell to be conducted by the write control signal supplied to the common write word line and to supply a second write signal to the second memory cell;
    a first read control circuit which is connected to the first memory cell to be conducted by a first read control signal supplied to a first read word line, and to read out a first read signal to the common read bit line from said first memory cell; and
    a second read control circuit which is connected to the second memory cell to be conducted by a second read control signal supplied to a second read word line, and to read out a second read signal to the common read bit line from said second memory cell,
    wherein the first and second write signals are set respectively in the first and second memory cells at a same time via the common write word line, and
    when either one of the first and second read control signals is input, the first or second read control circuit, which is conducted by the either one of the first and second read control signals outputs a readout signal from the first or second memory cell, which is connected to the first or second read control circuit, to the common read bit line.

2. The memory circuit according to claim 1, wherein the first write control circuit comprises:
    a first write control switching element, which is connected to the first memory cell, is conducted by the write control signal supplied to the common write word line, to supply the first write signal to the first memory cell; and
    a second write control switching element, which is connected to the first memory cell, is conducted by the write control signal supplied to the common write word line, to supply a reverse signal of the first write signal to the first memory cell;
    the second write control circuit comprises:
    a third write control switching element, which is connected to the second memory cell, is conducted by the write control signal supplied to the common write word line, to supply the second write signal to the second memory cell; and
    a fourth write control switching element, which is connected to the second memory cell, is conducted by the write control signal supplied to the common write word line, to supply a reverse signal of the second write signal to the second memory cell;
    the first read control circuit comprises:
    a first read control switching element, which is connected to the first memory cell, is conducted by the first read control signal supplied to the first read word line, to supply the first read signal readout from the first memory to the common read bit line; and
    the second read control circuit comprises:
    a second read control switching element, which is connected to the second memory cell, is conducted by the second read control signal supplied to the second read word line, to supply the second read signal readout from the second memory to the common read bit line.

3. The memory circuit according to claim 1, further comprising:
    a first write decoder for a high-order address;
    a second write decoder for a low-order address;
    a first read decoder for a high-order address; and
    a second read decoder for a low-order address, wherein
    the write control signal is controlled by the first write decoder;
    the first and second write signals are controlled by the second write decoder;
    the first and second read control signals are controlled by the first read decoder; and
    the first and second read signals are controlled by the second read decoder.

4. An information processing apparatus, comprising:
    a processing unit;
    a buffering unit to store data output from the processing unit, wherein
    the buffering unit comprises:
        first and second memory cells which are connected in parallel between a common write word line and a common read bit line;
        a first write control circuit which is connected to the first memory cell to be conducted by a write control signal supplied to the common write word line, and to supply a first write signal to the first memory cell;
        a second write control circuit which is connected to the second memory cell to be conducted by the write control signal supplied to the common write word line and to supply a second write signal to the second memory cell;
        a first read control circuit which is connected to the first memory cell to be conducted by a first read control signal supplied to a first read word line, and to read out a first read signal to the common read bit line from said first memory cell; and a second read control circuit which is connected to the second memory cell to be conducted by a second read control signal supplied to a second read word line, and to read out a second read signal to the common read bit line from said second memory cell, wherein the first and second write signals are set respectively in the first and second memory cells at a same time via the common write word line, and when either one of the first and second read control signals is input, the first or second read control circuit, which is conducted by the either one of the first and second read control signals outputs a readout signal from the first or second memory cell, which is connected to the first or second read control circuit, to the common read bit line.

5. A method for controlling write and read for a memory circuit having first and second memory cells connected in parallel between a common write word line and a common read bit line, the method comprising:

when a common write control signal is input to the common write word line, performing a first write by applying a first write signal to the first memory cell through a first write control circuit, which is connected by the common write control signal, and performing a second write by applying a second write signal to the second memory cell through a second write control circuit, which is connected by the common write control signal, wherein the first and second write signals are set respectively in the first and second memory cells at a same time via the common write word line;

performing a first read by reading out a first read signal from the first memory cell to a common bit line through a first read control circuit, which is connected by the first read control signal, when a first read control signal is input to a first read word line connected to the first memory; and performing a second read by reading out a second read signal from the second memory cell to the common bit line through a second read control circuit, which is connected by the second read control signal, when a second read control signal is input to a second read word line connected to the second memory.

* * * * *